Figure 2:
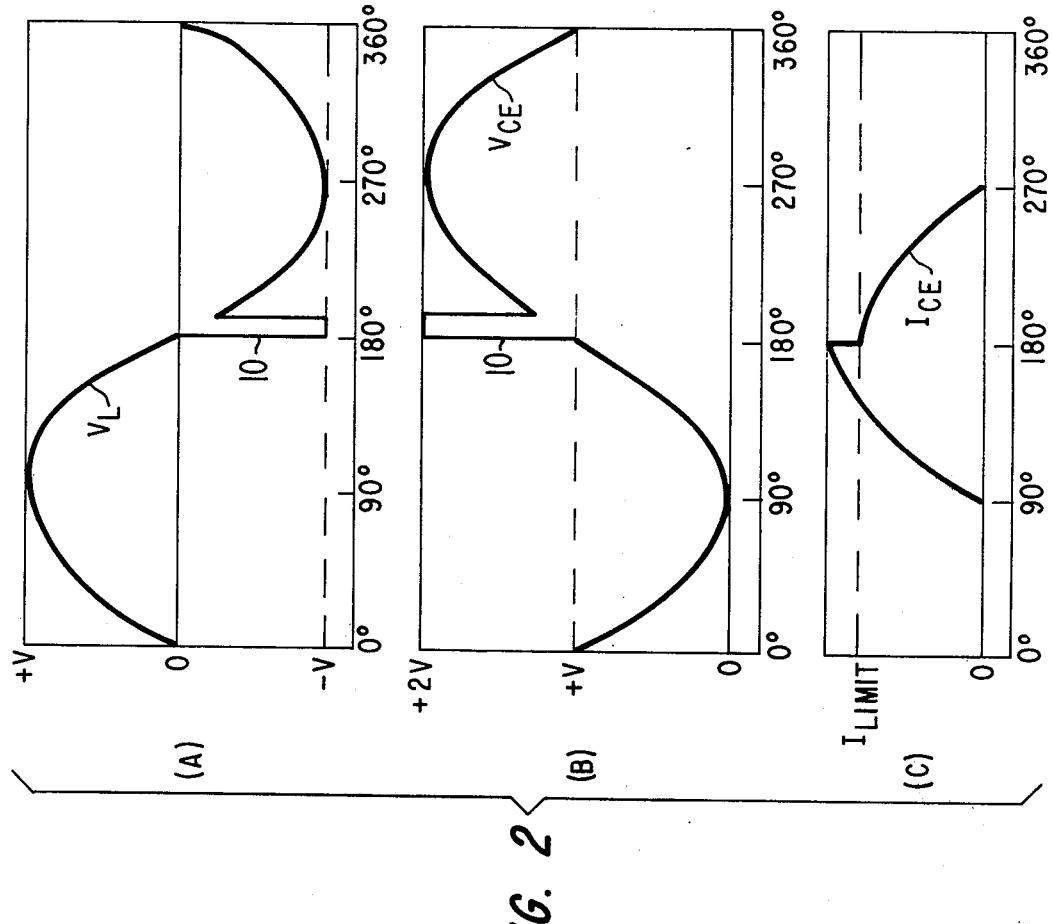

United States Patent [19]

Glogolja

[11] 3,980,930

[45] Sept. 14, 1976

[54] PROTECTION CIRCUIT

[75] Inventor: Miroslav Glogolja, Hillsborough, N.J.

[73] Assignee: RCA Corporation, New York, N.Y.

[22] Filed: May 1, 1975

[21] Appl. No.: 573,733

[52] U.S. Cl. .............................. 317/16; 317/33 R; 317/33 SC; 317/50; 330/207 P
[51] Int. Cl.² .......................................... H02H 7/20
[58] Field of Search .......... 317/16, 31, 33 R, 33 SC, 317/50; 330/207 P; 307/202 R

[56] References Cited
UNITED STATES PATENTS

| | | | |
|---|---|---|---|
| 3,359,434 | 12/1967 | Galluzzi | 317/16 X |
| 3,536,958 | 10/1970 | Sondermeyer | 330/207 R |
| 3,544,720 | 12/1970 | Corderman | 330/207 P |
| 3,555,358 | 1/1971 | Gibbs | 317/16 |
| 3,597,655 | 8/1971 | Forte | 317/16 |
| 3,668,545 | 6/1972 | Von Recklinghausen | 317/16 X |
| 3,819,986 | 6/1974 | Fukuoka | 317/16 |

Primary Examiner—Harry Moose
Assistant Examiner—Patrick R. Salce
Attorney, Agent, or Firm—H. Christoffersen; S. Cohen; K. Watov

[57] ABSTRACT

It is known in the art to place a low impedance path across the input circuit of an output amplifier when the power dissipation of the amplifier exceeds a given value. The present circuit includes, in addition, a gate controlled rectifier, the main conduction path of which is connected across the output terminals of the amplifier, and which is turned on in response to a flow of current through this low impedance path. This additional circuit protects the amplifier from voltage spikes produced, for example, by an inductive load, such as a speaker driven by the amplifier.

11 Claims, 3 Drawing Figures

U.S. Patent  Sept. 14, 1976  Sheet 1 of 2  3,980,930

PROTECTION CIRCUIT

Power dissipation limiting circuits have been employed in the prior art for protecting the output transistors of transistor amplifiers from over-dissipation. Such over-dissipation, if permitted, could damage or destroy the output transistors. In a load-line limiting circuit, for example, a voltage is produced which is proportional to the collector-emitter current of the output transistor. This voltage is combined with a voltage proportional to the load voltage, and the combined voltage is employed to control the conduction of a protective transistor connected between the input circuit of the output transistor and the load. Whenever the combined voltage exceeds a given value indicative of an over-dissipation condition, the protective transistor is made conductive. This reduces the input signal to the output transistor which, in turn, reduces the emitter-to-collector current of (the dissipation of) the output transistor.

The circuit described above has been found not to fully protect the amplifier under certain circumstances. One is when the load is inductive, for example a loudspeaker. Such a load may provide an inductive kickback, that is, a voltage spike in response to the initial conduction of the protective transistor(s), which may damage the output transistor.

A protective diode may be coupled between the load and the voltage supply coupled to the collector of the output transistor, to limit the amplitude of the inductive kickback discussed above. This reduces the susceptibility of the output transistor to damage. However, it has been discovered that if the inductive kickback produces voltage spikes of relatively long time duration, even though the amplitude of the spikes is limited by the protective diodes, the output transistor can be damaged or destroyed. The reasons are given later in the discussion of FIG. 1. The voltage spikes may also damage the inductive load such as a loudspeaker.

With the problems of the prior art in mind, the present invention recognizes that in addition to the circuit for reducing the dissipation of the output transistor(s) of the amplifier, circuitry must be provided to substantially eliminate the voltage spikes caused by the inductive kickback. In accordance with an embodiment of the invention, this circuitry comprises means for placing a low impedance across the output terminals of the amplifier in response to operation of the circuit for reducing the dissipation of the output transistor(s).

Figure 1:
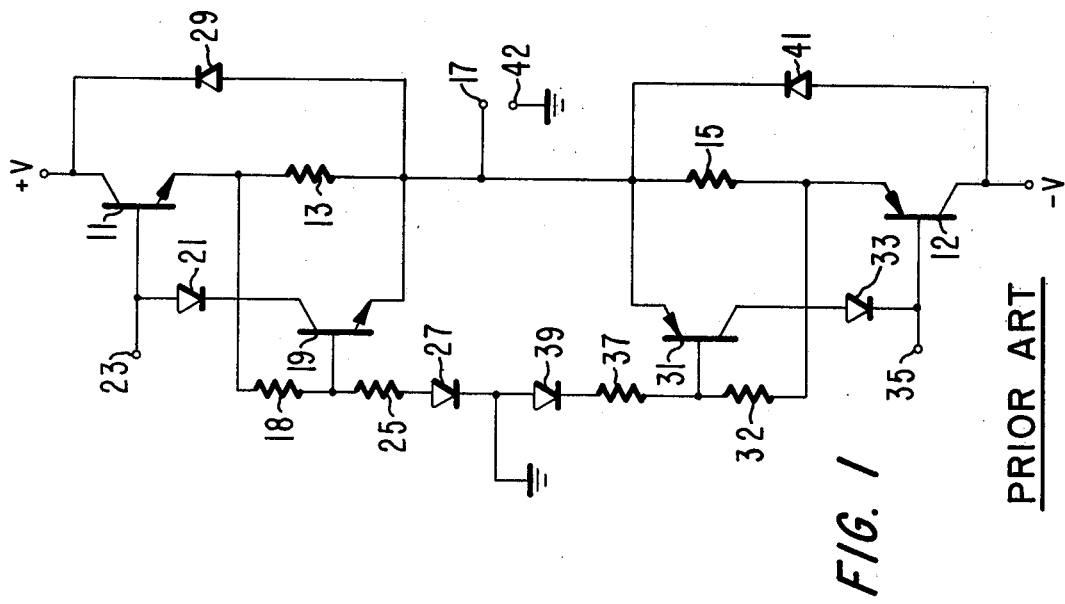
Figure 3:
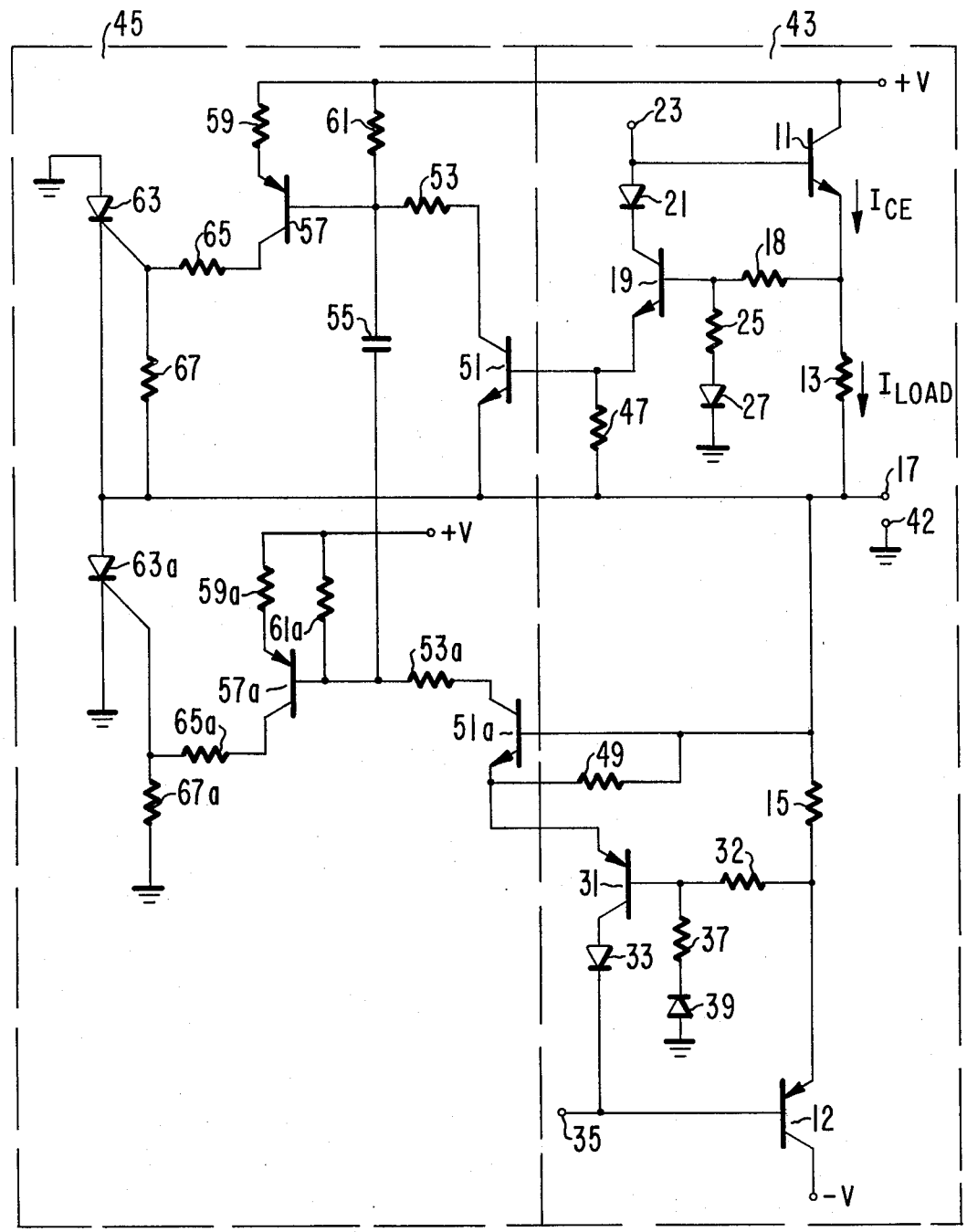

In the drawing:

FIG. 1 is a schematic diagram of a prior art loadline limiting protection circuit;

FIG. 2 is illustrative of the voltage waveform (A) across an inductive load during one cycle of a sinusoidal input signal, a portion of which overdrives one of the output transistors, a concurrent waveform (B) of the collector-emitter voltage of the output transistor being overdriven, and the concurrent waveform (C) of the collector-emitter current flowing through the output transistor; and FIG. 3 is a schematic diagram of the protection circuit of the present invention.

The prior art load-line limiting circuit shown in FIG. 1 is similar to that described in U.S. Pat. Nos. 3,536,958 to Sondermeyer and 3,500,218 to Burwen. Its operation will be discussed, in brief, later.

The protection circuit of the present invention is shown in FIG. 3. The circuit includes a substantial portion of the prior art protection circuit (shown at 43), with the addition thereto of two substantially identical "crowbar" circuits 45. Diodes 29 and 41 of the prior art circuit have been eliminated, and emitter resistors 47, 49 have been added between the emitter electrodes of transistors 19 and 31 of the prior circuit and output terminal 17, respectively. The voltage drops across emitter resistors 47, 49, occurring when transistors 19 and 31 are conductive, provide control signals for operating the crowbar circuits 45.

As the two crowbar circuits of FIG. 3 are essentially identical, only one of them will be described in detail. It includes an NPN transistor 51 having a collector electrode coupled by a resistor 53 to capacitor 55, and to the base electrode of a PNP transistor 57. the emitter and base electrodes of transistor 57 are individually coupled to the positive voltage +V line by a pair of resistors 59 and 61, respectively. The collector electrode of transistor 57 is coupled to the gate electrode of silicon controlled rectifier (SCR) 63 by resistor 65. The gate electrode of the SCR 63 is coupled by a resistor 67 to output terminal 17; its anode electrode is connected to a point of reference potential, ground in this example, and its cathode electrode is connected to the anode electrode of SCR 63a and to output terminal 17. (The gate electrode of SCR 63a is coupled by resistor 67a to ground and its cathode electrode is directly connected to ground.)

Returning now to the FIG. 1 circuit, assume that a sinusoidal signal is applied across input terminals 23 and 35. Assume that this signal is of sufficient magnitude to cause the output signal between terminals 17 and 42 to swing between the positive and negative supply voltages +V, −V. Assume also that an inductive load (not shown), such as a loudspeaker, is connected across terminals 17 and 42. The load voltage $V_L$, the voltage $V_{CE}$ across the collector-emitter electrodes of output transistor 11, and the collector-emitter current $I_{CE}$ of output transistor 11, will have waveforms as shown in FIG. 2 (A), (B), and (C). As shown in FIG. 2, the current $I_{CE}$ through transistor 11 will increase towards a maximum or current limit magnitude, as the voltage $V_{CE}$ across output transistor 11 increases toward the positive voltage +V. As shown, the current $I_{CE}$ lags the voltage $V_{CE}$ by 90°, due to the inductive load.

Diode 27, in combination with resistor 25, permits voltage limiting, in addition to current limiting by the protective circuit, whenever diode 27 is forward biased. For a voltage swing at the output terminal 17 to a negative value, resistor 25 is decoupled by the backbias of diode 27, but positive current $I_{CE}$ still flows through transistor 11 because of the phase shift caused by the inductive load. As a result, protection transistor 19 will then only respond to output transistor 11 current $I_{CE}$ through resistor 13, that is, the voltage drop developed across resistor 13. Therefore, for collector-emitter voltages across transistor 11 greater than the supply voltage +V, the circuit operates as only a current limiting system.

For collector-emitter voltages across transistor 11 less than the supply voltage +V, corresponding to a positive voltage across the load, diode 27 is forward biased, and a bridge network is formed including resistors 13, 18, 25, and the load impedance connected across output terminals 17 and 42. The bridge network provides current and voltage limiting of output transistor 11. Voltage limiting is provided when the voltage at output terminal 17 is 1 $V_{be}$ less than the voltage at the common connection of the base of transistor 19 and resistors 18 and 25, causing transistor 19 to go into conduction. The voltage drop across the load is inversely related to the $V_{CE}$ of output transistor 11. The current limiting function is, in this case, inherent with the voltage limiting function.

A second protection circuit including transistor 31, resistors 15, 32, 37 and diode 39 combine to provide similar load-line limiting for transistor 12. The pair of protection circuits operate on alternate polarities of input signal drive to protect and limit the operation of the complementary output transistors 11, 12, which conduct on alternate polarities to drive the common load.

Diodes 21 and 33 are individually connected in series with the collectors of transistors 19 and 31, respectively, to prevent forward bias of the collector-base junctions of transistors 19 and 31, during alternate polarities of the audio input signal. In this manner, distortion is substantially eliminated in the output signal.

For example, the parameters of the protective circuit can be chosen to cause transistor 19 to become conductive when the voltage $V_{CE}$ across the collector-emitter electrodes of output transistor 11 exceed the amplitude of the positive supply voltage, at a time when the current through the collector-emitter path of transistor 11 has a magnitude greater than the current limit magnitude. When transistor 19 becomes conductive, it shunts the drive signal or current away from the base electrode of output transistor 11 to the output terminal 17, causing the magnitude of the current $I_{CE}$ through transistor 11 to drop to the current limit magnitude. A more detailed description of the operation of protective circuit 43 is given in Sondermeyer U.S. Pat. No. 3,536,958.

When transistor 19 becomes conductive, a voltage spike L(di/dt) is produced between terminals 17 and 42, in response to the sudden change in current (di) applied to the coil (whose inductance is L) of the loudspeaker. Clipping diode 41 prevents the voltage spike from becoming more negative than −V, the negative supply voltage level, as shown in FIG. 2A. In similar fashion, clipping diode 29 limits the amplitude of the positive spikes appearing at output terminal 17 to the positive supply level +V, thereby protecting transistor 11.

The complementary output stage of FIG. 1 is balanced, in that the amplitudes of the positive supply +V and negative supply −V are equivalent, and similar circuit parameters have equivalent values. Accordingly, the voltage $V_{CE}$ across transistor 11 is limited to swing twice the amplitude of the positive supply voltage +V, as shown in FIG. 2B. So long as the width of the voltage spikes 10 produced by the inductive kickback of the loudspeaker coil are relatively narrow, that is, of short duration, the output transistors 11 and 12 will be adequately protected. If the duration of the spikes becomes excessive, the power dissipation in output transistors 11 or 12 may be exceeded, resulting in their destruction. This is often the case in practice, for as shown in FIG. 2, with respect to output transistor 11, the spikes 10 occur just after protective transistor 19 goes into conduction. The spikes cause a voltage $V_{CE}$ of twice the supply voltage potential +V to be developed across the collector-emitter electrodes of transistor 11, at a time when the collector-emitter current $I_{CE}$ of transistor 11 is of relatively large magnitude. If the spikes are not of short duration, the power dissipation capability of transistor 11 may be exceeded, due to the concurrence of the high magnitude current $I_{CE}$ and high collector-emitter voltage $V_{CE}$. Spikes of opposite polarity cause a similar problem as to protection of transistor 12.

The operation of the common parts of the FIG. 3 and FIG. 1 circuits are similar. For example, the values of resistors 13, 18, and 25 in both circuits are chosen to cause transistor 19 to become conductive, whenever the power dissipation of output transistor 11 exceeds a given or safe operating value. Similarly, the values of resistors 15, 32, and 37 are chosen to cause transistor 31 to become conductive whenever the power dissipation of output transistor 12 exceeds a predetermined level.

Referring now to FIG. 3, assume that there is an overload condition and protective transistor 19 is driven into conduction. The voltage drop or control signal developed across resistor 47 is then sufficiently high to drive transistor 51 into saturation. This causes the voltage at the base of transistor 57 to drop sufficiently to drive transistor 57 into saturation. Capacitor 55 will act to slightly delay the turn-on of transistor 57 to provide stability of triggering.

When transistor 57 saturates, the resultant current flow through resistor 67 causes a voltage to be developed which exceeds the triggering level of SCR 63 and as this voltage appears at the gate electrode of SCR 63, the latter turns on. It now "crowbars" or provides a low impedance path (its anode-to-cathode path) from output terminal 17 to ground, thereby shunting to ground any voltage spikes caused by the inductive kickback of the loudspeaker.

The crowbar circuit protecting output transistor 12 operates in a similar manner, whenever the power dissipation of output transistor 12 exceeds a predetermined value. In this manner, output transistors 11 and 12 are protected from destruction due to relatively long time duration spikes.

During positive input signal excursions, the protective circuit for output transistor 11 will operate to protect that transistor from over-dissipation. Similarly, during negative input signal excursions, the protective circuit for output transistor 12 will operate to protect that transistor from over-dissipation. Whenever the protective circuit operates to protect output transistor 11, the voltage drop across the loudspeaker (across output terminal 17 and ground terminal 42) will be slightly negative, equivalent to the voltage drop across the anode-cathode electrodes of fired SCR 63 of the crowbar circuit protecting output transistor 11. Similarly, whenever the protective circuit operates to protect output transistor 12, the SCR 63a of that circuit will have a small positive voltage across its anode and cathode electrodes, this voltage appearing also across the loudspeaker. Therefore, the loudspeaker, which could also be damaged by the voltage spikes is also protected. Whenever the input signal voltage amplitude excursions decrease below values which could overdrive output transistor 11 or 12, the protective circuit will automatically reset, and the output transistors 11 and 12 will track the input signal. Also, whenever either SCR 63 or SCR 63a is turned on, they will shunt the inductive load with the low value resistance formed by their anode-cathode current path, effectively presenting a resistive load to the amplifier. At such times, the voltage $V_{CE}$ across and current $I_{CE}$ through output transistors 11 or 12, or both, will be in phase.

The parameters of the two crowbar circuits 45 have been described as being identical. If desired, there parameters can be made different to obtain different triggering levels for each one of the crowbar circuits 45.

What is claimed is:

1. A protective circuit for protecting an output transistor of an amplifier driving an inductive load, said output transistor having a collector electrode connected to a terminal for a source of operating voltage, an emitter electrode, and a base electrode receptive of an input signal, said amplifier further including a first output terminal coupled to the emitter electrode of said output transistor, and a second output terminal, said inductive load being connected between these terminals, comprising:

limiting means coupled between the emitter and base electrodes of said output transistor, responsive to power dissipation of greater than a given value of said output transistor, for limiting the amplitude of the input signal coupled to the base electrode of said output transistor, and for providing a control signal at such times, said limiting of the amplitude of said input signal, when it occurs, resulting in a reduction in current flow to said inductive load and a corresponding relatively high-level voltage spike produced by said inductive load which can, if sufficient current is still passing through said output transistor, damage said transistor; and circuit means responsive to said control signal for suppressing the production of said voltage spike, said means comprising means for placing a low impedance between said output terminals.

2. A protective circuit as set forth in claim 1, wherein said circuit means comprises a gate controlled rectifier having a gate electrode and a conduction path, said conduction path being connected between said two output terminals, and said gate electrode being connected to respond to said control signal.

3. A protective circuit as set forth in claim 2, wherein said limiting means comprises a current path connected between said base electrode and said first output terminal, and means responsive to said power dissipation of greater than a given value for switching said path from a high to a low impedance condition, for diverting the input signal from said base electrode to said current path, and wherein said protective circuit includes means responsive to said flow of current through said current path for producing said control signal.

4. A protective circuit as set forth in claim 3, wherein said circuit means further includes:

a first switching transistor having a base electrode receptive of said control signal, for switching said first switching transistor into saturation, an emitter electrode connected to said first output terminal, and a collector electrode coupled to said operating voltage terminal; and a second switching transistor having a base electrode coupled to the collector electrode of said first switching transistor, the saturation of said first switching transistor causing said second switching transistor to in turn saturate, an emitter electrode coupled to said operating voltage terminal, and a collector electrode coupled to said gate electrode of said gate controlled rectifier for supplying a turn-on signal at said gate electrode, when said second transistor is switched into saturation.

5. A circuit for protecting an output transistor of an amplifier for driving an inductive load, said transistor having collector, emitter, and base electrodes, comprising:

a terminal for a source of voltage connected to said collector electrode;

first and second output terminals across which said inductive load is connected, the first coupled to said emitter electrode, and the second to a point of reference potential, respectively;

protective means responsive to the current flowing through the collector-to-emitter path of said output transistor, for placing a low impedance path between said base electrode and said first output terminal, for limiting the power dissipation of said output transistor to below a predetermined level, whereby, when said protective means is activated said current is immediately reduced, resulting in inductive kickback from said inductor, which manifests itself as a voltage spike having a level at least as great as said source of voltage, which may, if of sufficient duration, damage said transistor; and means for suppressing the production of said voltage spike, said suppression means comprising means responsive to the operation of said first protective means for providing a low impedance current path between said two output terminals.

6. The circuit of claim 5, wherein said protective means includes;

a first transistor having a collector electrode coupled to the base electrode of said output transistor, an emitter electrode coupled to said first output terminal, and a base electrode;

means coupled between said emitter electrode of said first transistor and point of reference potential, for providing a turn-on signal at the base of said first transistor, whenever the power dissipation of said output transistor reaches a predetermined level.

7. The circuit of claim 6, wherein said suppression means includes;

switching means responsive to the turn-on of said first transistor, for providing a control signal; and a gate controlled rectifier having a gate electrode responsive to said control signal, and anode and cathode electrodes coupled between said first output terminal and reference potential.

8. The circuit of claim 7, wherein said switching means includes;

a second transistor having an emitter electrode connected to said first output terminal, a collector electrode coupled to said voltage source terminal, and a base electrode coupled to the emitter electrode of said first transistor, said second transistor saturating in response to turn-on of said first transistor;

a third transistor having an emitter electrode coupled to said voltage source terminal, a base electrode coupled to the collector of said second transistor, and a collector electrode, said third transistor saturating in response to said second transistor saturating; and voltage divider means connected between said collector electrode of said third transistor and said first output terminal, for providing said control signal to the gate electrode of said gate controlled rectifier.

9. In a circuit for protecting an output transistor of an amplifier for driving an inductive load, said output transistor having collector, emitter, and base electrodes, said circuit including a terminal for a source of voltage at said collector electrode, a first output terminal coupled to said emitter electrode, a second output terminal coupled to a source of reference potential, said inductive load being connected across said first and second output terminals, said base electrode being receptive of an input signal, and limiting means for limiting the power dissipation of said output transistor to a predetermined level, said limiting means being coupled between said base electrode and said first output terminal and responsive to the current flowing through the collector-to-emitter path of said output transistor, for providing a low impedance current path between said base electrode and said first output terminal to shunt input signals away from said base electrode, whenever said current exceeds a given value, whereby, when said limiting means is activated, the result is a substantially instantaneous reduction in current from said transistor to said inductor, further resulting in inductive kickback from said inductor producing a voltage spike, which if of high enough level and time duration, may damage said transistor, the improvement comprises;

means for providing a control signal in response to operation of said limiting means; and means for suppressing said voltage spike comprising means for placing a low impedance current path between said two output terminals in response to said control signal.

10. The circuit of claim 9, wherein said control signal providing means includes a resistor connected in series with and within said low impedance current path of said power dissipation limiting means, the voltage developed across said resistor, during the operation of said limiting means, being said control signal.

11. The circuit of claim 9, wherein said means responsive to said control signal for providing a low impedance current path between said two output terminals, is a crowbar circuit including:

a first transistor having a base electrode, said base electrode being said input terminal, an emitter electrode connected to said first output terminal, and a collector electrode resistively coupled to said source of voltage;

a second transistor having a base electrode resistively coupled to both said voltage source and said collector electrode of said first transistor, an emitter electrode resistively coupled to said voltage source terminal, and a collector electrode resistively coupled to said first output terminal; and a gate controlled rectifier having a gate electrode coupled to the collector electrode of said second transistor, and anode and cathode electrodes connected between said two output terminals.

* * * * *